(12) United States Patent
Zhang et al.

(10) Patent No.: US 11,527,483 B2
(45) Date of Patent: Dec. 13, 2022

(54) PACKAGE INCLUDING FULLY INTEGRATED VOLTAGE REGULATOR CIRCUITRY WITHIN A SUBSTRATE

(71) Applicant: Intel Corporation, Santa Clara, CA (US)

(72) Inventors: Chong Zhang, Chandler, AZ (US); Krishna Bharath, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 997 days.

(21) Appl. No.: 16/024,717

(22) Filed: Jun. 29, 2018

(65) Prior Publication Data

US 2020/0006239 A1 Jan. 2, 2020

(51) Int. Cl.
| | | |
|---|---|---|
| *H01L 23/538* | (2006.01) |
| *H01L 23/13* | (2006.01) |
| *H01L 51/10* | (2006.01) |
| *H01L 23/367* | (2006.01) |
| *H01L 23/373* | (2006.01) |
| *H01F 27/28* | (2006.01) |
| *H01L 21/48* | (2006.01) |
| *H01L 51/00* | (2006.01) |

(Continued)

(52) U.S. Cl.
CPC ..... *H01L 23/5389* (2013.01); *H01F 27/2804* (2013.01); *H01L 21/4846* (2013.01); *H01L 23/13* (2013.01); *H01L 23/367* (2013.01); *H01L 23/3736* (2013.01); *H01L 23/5384* (2013.01); *H01L 23/5386* (2013.01); *H01L 24/32* (2013.01); *H01L 24/83* (2013.01); *H01L 25/16* (2013.01); *H01L 51/0004* (2013.01); *H01L 51/0026* (2013.01); *H01L 51/0096* (2013.01); *H01L 51/10* (2013.01); *H01F 2027/2809* (2013.01); *H01L 29/7869* (2013.01); *H01L 51/0048* (2013.01); *H01L 2224/32245* (2013.01); *H01L 2924/1307* (2013.01); *H01L 2924/13061* (2013.01); *H01L 2924/13069* (2013.01); *H01L 2924/1427* (2013.01); *H01L 2924/19042* (2013.01); *H01L 2924/19102* (2013.01)

(58) Field of Classification Search
CPC ... H01L 23/13; H01L 23/367; H01L 23/3736; H01L 23/5384; H01L 23/5386; H01L 23/5389; H01L 21/4846; H01L 2225/06541; H01L 2225/06548; H01L 2924/1427; H01L 2924/19042
USPC .................................................. 257/531, 40
See application file for complete search history.

(56) References Cited

U.S. PATENT DOCUMENTS 8,912,670 B2 * 12/2014 Teh .................. H01L 21/56
257/E23.101
9,679,843 B2 * 6/2017 Starkston ............... H01L 25/50

(Continued)

*Primary Examiner* — Khiem D Nguyen
(74) *Attorney, Agent, or Firm* — Schwabe, Williamson & Wyatt P.C.

(57) ABSTRACT

Embodiments herein relate to integrating FIVR switching circuitry into a substrate that has a first side and a second side opposite the first side, where the first side of the substrate to electrically couple with a die and to provide voltage to the die and the second side of the substrate is to couple with an input voltage source. In embodiments, the FIVR switching circuitry may be printed onto the substrate using OFET, CNT, or other transistor technology, or may be included in a separate die that is incorporated within the substrate.

9 Claims, 8 Drawing Sheets

(51) Int. Cl.
 *H01L 23/00* (2006.01)
 *H01L 25/16* (2006.01)
 *H01L 29/786* (2006.01)

(56) References Cited

U.S. PATENT DOCUMENTS

| | | | | |
|---|---|---|---|---|
| 9,741,664 | B2* | 8/2017 | Chiu | H01L 23/5385 |
| 9,999,129 | B2* | 6/2018 | Guzek | H05K 1/165 |
| 10,396,046 | B2* | 8/2019 | Deng | H01L 24/16 |
| 2008/0153209 | A1* | 6/2008 | Liu | H01L 23/367 |
| | | | | 438/114 |
| 2008/0157330 | A1* | 7/2008 | Kroehnert | H01L 25/0657 |
| | | | | 257/686 |
| 2013/0342435 | A1* | 12/2013 | Limketkai | G02F 1/167 |
| | | | | 345/107 |
| 2014/0217547 | A1* | 8/2014 | Elsherbini | H01L 28/10 |
| | | | | 257/531 |
| 2015/0123090 | A1* | 5/2015 | Musiol | H01L 51/0068 |
| | | | | 257/40 |
| 2015/0302974 | A1* | 10/2015 | Zhao | H01F 17/0013 |
| | | | | 336/200 |
| 2016/0372449 | A1* | 12/2016 | Rusu | H01L 23/64 |
| 2018/0006005 | A1* | 1/2018 | Cheng | H01L 21/561 |
| 2018/0145042 | A1* | 5/2018 | Lim | H01F 27/2823 |

* cited by examiner

PACKAGE INCLUDING FULLY INTEGRATED VOLTAGE REGULATOR CIRCUITRY WITHIN A SUBSTRATE

FIELD

Embodiments of the present disclosure generally relate to the field of package assemblies, and in particular package assemblies having high thermal conductivity.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Continued reduction in end product size of mobile electronic devices such as smart phones and ultrabooks is a driving force for the development of reduced size system in package components.

DETAILED DESCRIPTION

Figure 1:
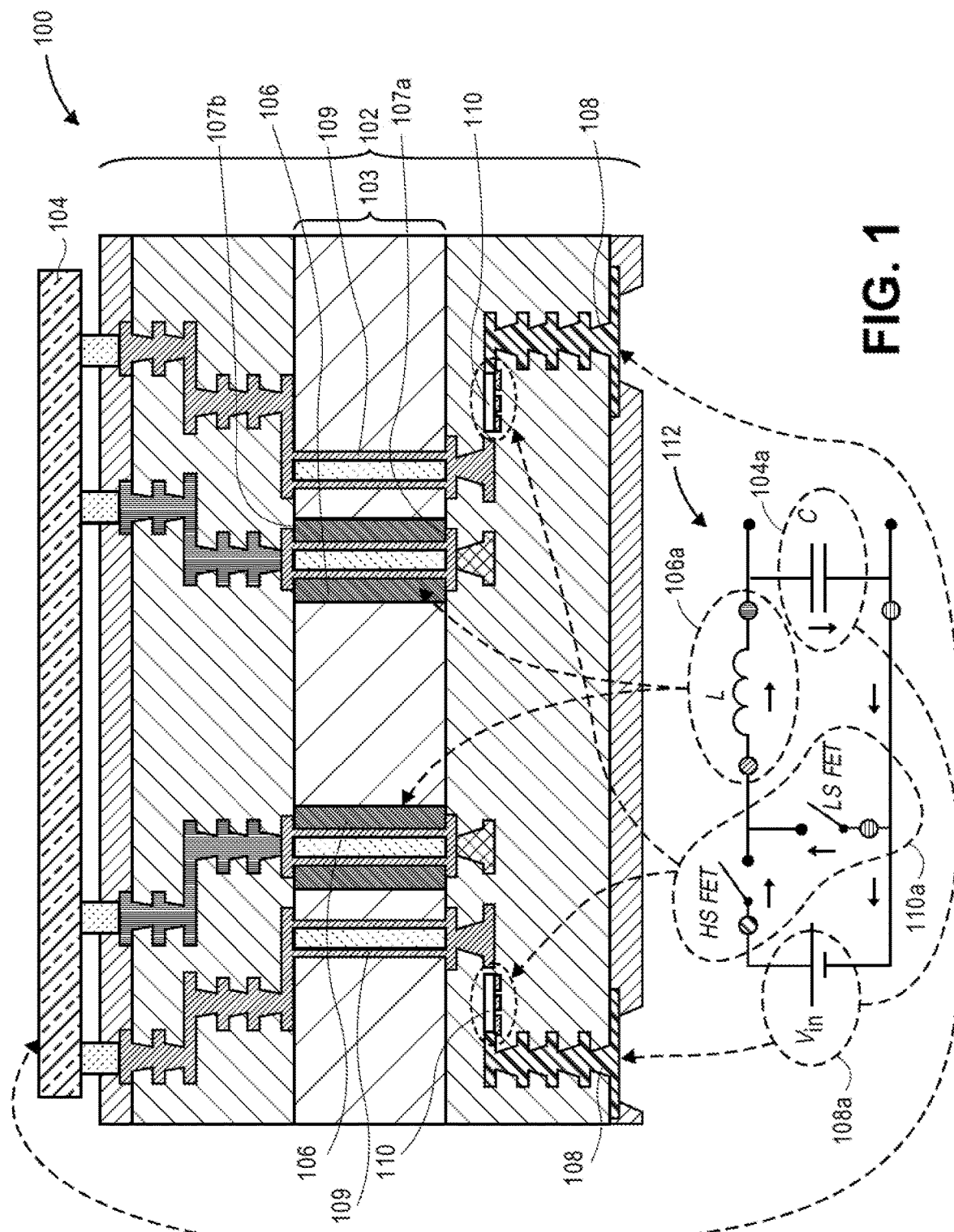
FIG. 1 illustrates an example of a package assembly that includes fully integrated voltage regulator (FIVR) circuitry in a substrate, in accordance with embodiments.

Embodiments of the present disclosure may generally relate to including components of a FIVR, in particular switching components, into a package substrate that is to provide power to a die attached to the substrate. In embodiments, the FIVR components may be implemented as a carbon nanotube transistor, organic field effect transistor (OFET), oxide thin-film transistors, or other type of transistor fabrications on a package substrate. FIVR components may be implemented as one or more discrete die to be embedded into one or more substrates within the package. These implementations may be combined with inductors, for example air core inductors or magnetic inductors, that may be included within the package.

In legacy implementations, FIVRs have been implemented within central processing units (CPUs) or within other dies that may be attached to the die side of a package. In these legacy implementations, field effect transistors (FET) and related circuitry to implement FIVRs may increase the overall size of the die, for example, by 5 percent. Increasing die size may lead to lower fabrication yields and therefore higher die production costs.

Embodiments described herein may reduce CPU (or other) die sizes, increase die yields and reduce die costs by moving components of the FIVR to the package. In addition, with these techniques, power routing within a package substrate may be simplified. For example, fewer micro-vias and traces caring high current may be needed for power routing, which may also reduce heat generated inside the package.

Additionally, in embodiments, the substrate area needed for FIVR may also be reduced. For example, a single plated through hole (PTH) may be used as an inductor, depending upon inductance requirements. This technique may also facilitate package form factor scaling. Because the components managing the high current in FIVR are moved to the package substrate, the distance between the FIVR current components and logic blocks on the die may be increased, thus reducing interference that may affect the logic blocks.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the figures, and sizes, thicknesses, or dimensions may be assumed for some embodiments only where specifically indicated or discussed.

FIG. 1 illustrates an example of a package assembly that includes FIVR circuitry in a substrate, in accordance with embodiments. Diagram 100 shows package 102 with substrates coupled with a logic die 104. In embodiments, the logic die 104 may be a CPU. The package 102 may include a package core 103 as well as one or more components of a FIVR that include one or more inductors 106, plated through holes 109 that may be electrically coupled to the logic die 104, voltage source connections 108, and switches 110 on substrates within the package 102.

An example FIVR circuit diagram 112 shows an example of analogous FIVR components on substrates within the package 102. For example, high side (HS) FET that may be connected to a high-voltage potential and/or low side (LS) FET that may be connected to a low-voltage potential or a ground 110a may be implemented using switches 110, inductor 106a may be implemented by inductors 106, voltage source $V_{in}$ 108a may be implemented by voltage source connection 108, and capacitor (C) 104a may be implemented in the logic die 104 or in capacitors (not shown) mounted on the package substrate. Capacitor 104a may represent a component in a FIVR.

In embodiments, one or more inductors 106 may be electrically coupled (not shown) with the one or more switches 110. One or more inductors 106 may be electrically coupled (not shown) with PTH 109, which may serve as all or part of a gate control. In embodiments, the electrical coupling (not shown) may be accomplished through routing features within substrates in or on the surface of package 102. In embodiments, switches 110 may be implemented using OFET technology, carbon nanotube, or other transistor technology.

FIGS. 2A-2D illustrates an example of a package assembly that includes FIVR circuitry in a substrate at various stages of a manufacturing process, in accordance with embodiments.

Figure 2A:
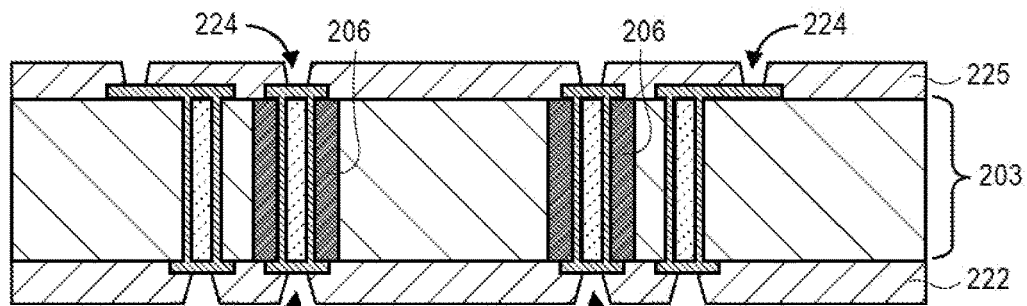
FIGS. 2A-2D illustrates an example of a package assembly that includes FIVR circuitry in a substrate at various stages of a manufacturing process, in accordance with embodiments.

FIG. 2A shows a package core 203 that may be similar to package core 103 of FIG. 1. The package core 203 may include inductors 206, which may be similar to inductors 106 of FIG. 1. In embodiments, the inductors 206 may be created using PTH that may be plated with copper (Cu). Other materials, such as magnetic materials, may be used to create the inductors 206. In embodiments, the package core 203 may be created by any known substrate process. In embodiments, the core layer 203 may not be included, and the inductors 206 may be implemented on other substrate layers (not shown) within the package 102.

In embodiments, a first laminate layer 222 and/or a second laminate layer 225 may be laminated on the package core 203. In embodiments, the first laminate layer 222 and/or the second laminate layer 225 may be an Ajinomoto Build-up Film (ABF) laminate or may be a build-up layer. In embodiments, vias 224 may be created in the first laminate layer 222 or the second laminate layer 225 to facilitate an electrical coupling of one or more electrical components within the package core 203, for example inductor 206. In embodiments, the vias 224 may be created by laser drilling followed by a desmear process, or by an etching process.

Figure 2B:
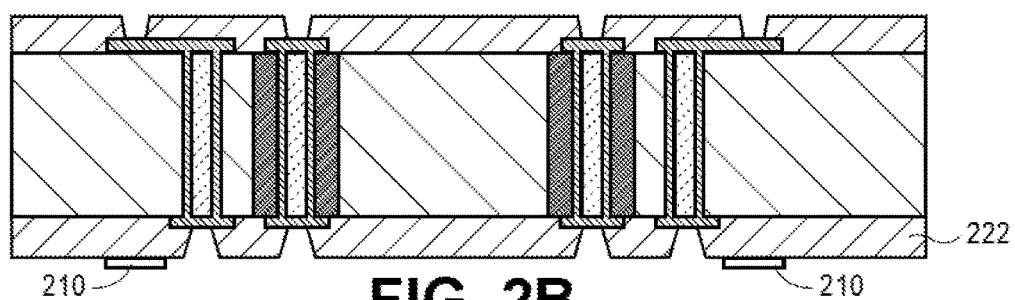

FIG. 2B shows a switch 210, which may be similar to switch 110 of FIG. 1, that is printed on the first laminate layer 222. In embodiments, the switch 210 may be applied using lithography or printing/laser sintering, as may be described below.

Figure 2C:
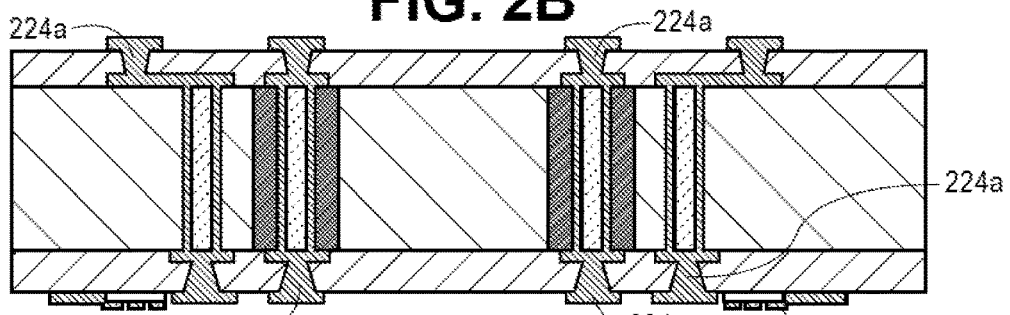

FIG. 2C shows the results of a semi-additive process or other processes to fill the vias 224 and plate a Cu or other metal pattern on the first laminate layer 222 or the second laminate layer 225. In embodiments, capacitors and/or other circuitry (not shown) may be printed together, or in some other sequence, along with the switch 210. For example, elytic Cu, or some other suitable metal, may be used to create routings 226 for example, for terminals of gates, sources, and/or drains on the first laminate layer 222 or the second laminate layer 225.

Other processes that may be used may include electroless Cu application, dry film resists (DFR) lamination/exposure/development, DFR stripping, flash etching, and/or Cu roughening. In embodiments, a dummy Cu block (not shown) may be plated on or near to the switch 210 as a heat sink. In embodiments, the vias 224 may have Cu or some other metal applied to create filled vias 224a.

Figure 2D:
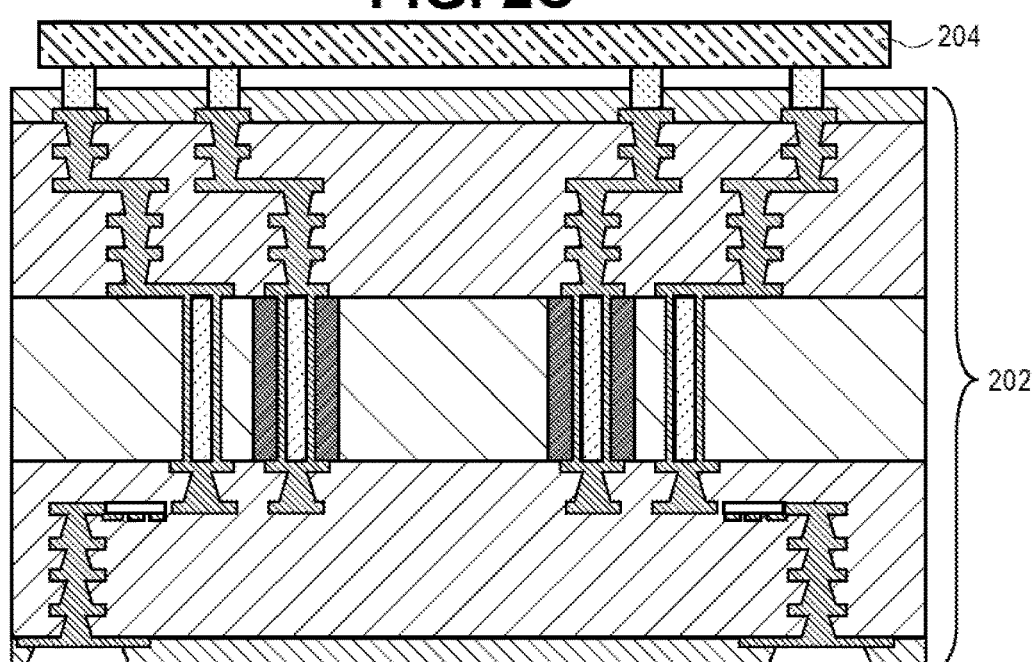

FIG. 2D shows additional elements to manufacture the package 202, which may be similar to package 102 of FIG. 1, applied. The logic die 204, which may be similar to logic die 104 of FIG. 1, may also be coupled to the package 202.

Figure 3:
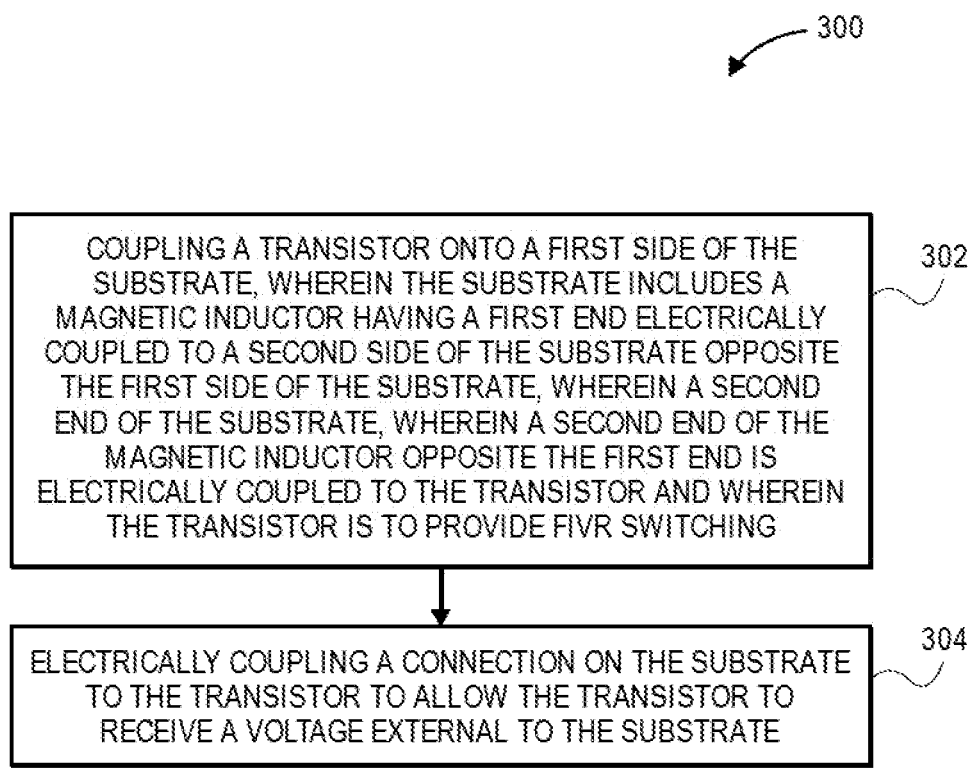
FIG. 3 illustrates an example of a process for manufacturing a package assembly that includes FIVR circuitry in a substrate, in accordance with embodiments.

FIG. 3 illustrates an example of a process for manufacturing a package assembly that includes FIVR circuitry in a substrate, in accordance with embodiments. In embodiments, process 300 may be performed by one or more of the techniques, processes, or actions described with respect to FIGS. 1-2D.

At block 302, the process may include coupling a transistor onto a first side of the substrate, wherein the substrate includes an inductor having a first end electrically coupled to a second side of the substrate opposite the first side of the substrate, wherein a second end of the inductor opposite the first end is electrically coupled to the transistor and wherein the transistor is to provide FIVR switching. In embodiments, the transistor may be similar to switch 110 of FIG. 1, the first side of the substrate may be similar to first laminate layer 222 of FIG. 2. The inductor may be similar to inductor 106, where the first end of the inductor may be similar to 107a and the second end of the inductor may be similar to 107b.

In embodiments, the switch 110 may be an OFET manufactured using nanoparticles. For example, a nanoparticle solution may be printed, for example by inkjet, on plastic. A focused argon (Ar) ion laser beam may scan the printed nanoparticles and may selectively induce sintering to form a conductor pattern. A washout of unsintered nanoparticles may occur and may be followed by inkjet printing of a poly(4-vynlphenol) (PVP) dielectric layer. Inkjet printing of another nanoparticle solution line on top of the PVP layer may be performed and a focused Ar ion laser beam may be implemented to define source and drain electrodes. A washout of unsintered nanoparticles may be performed to expose selectively sintered electrodes. Then, inkjet printing and thermal annealing of a semiconducting polymer may be performed to create a drain, source, and gate for the switch 110.

In embodiments, the switch 110 may be an OFET manufactured using lithography or laser sintering. In embodiments, a polymer substrate, which may include ABF or core material, may be disposed under the gate. The material for the gate, drain, and/or source may be fabricated with lithography or laser sintering. A PVP may be printed on the substrate a semiconducting polymer, such as carboxylate-functionalized polythiophene, may be printed on the substrate. In embodiments, the fabrication technology may either be printing or photolithography. The embodiments described above may not require a high temperature environment, and may be compatible with a standard substrate manufacturing process.

At block 304, the process may include electrically coupling a connection on the substrate to the transistor to allow the transistor to receive a voltage external to the substrate. In embodiments, the connection may be similar to voltage source connection 108 of FIG. 1.

Figure 4:
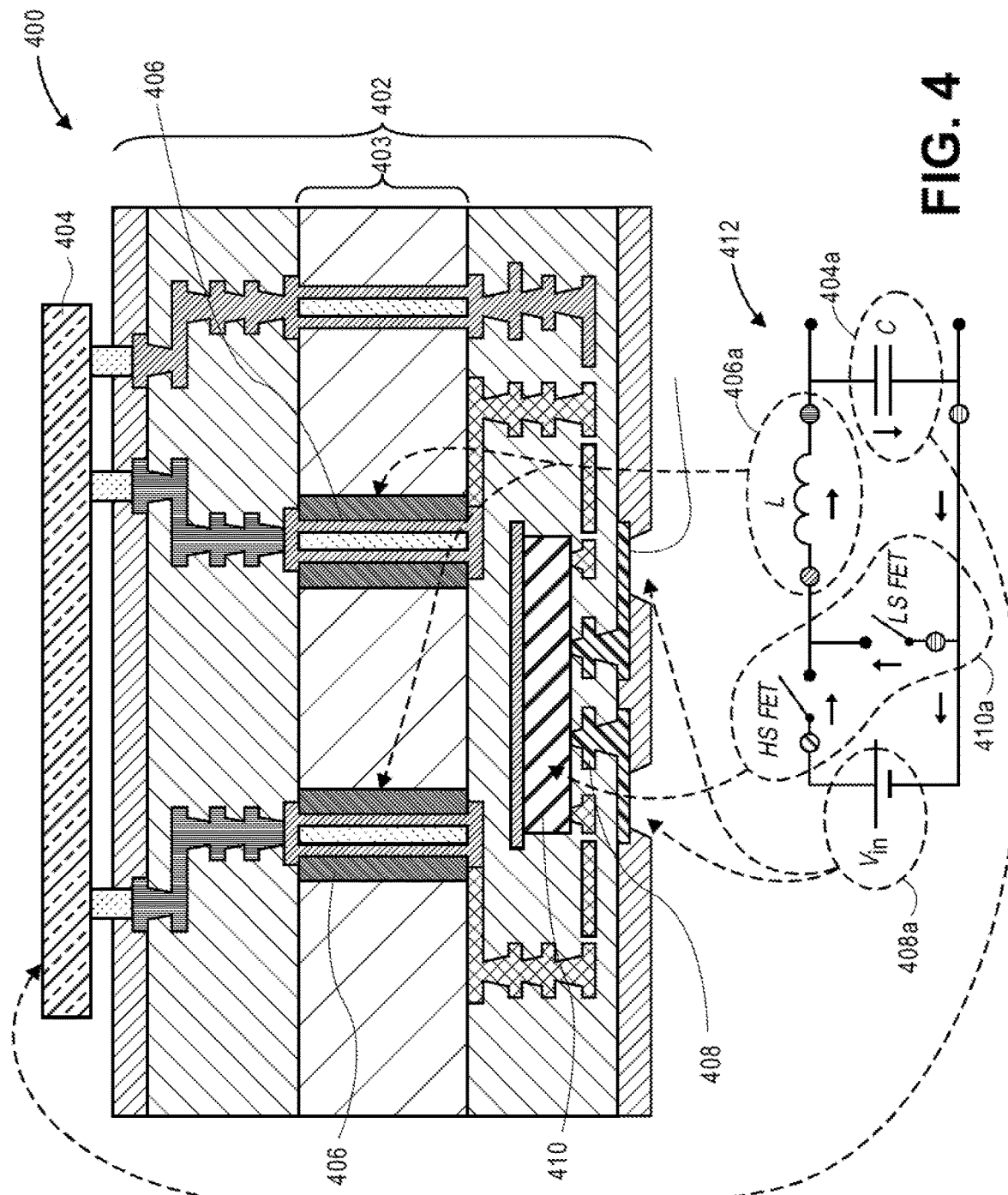
FIG. 4 illustrates an example of a package assembly that includes FIVR circuitry in a die embedded in the package, in accordance with embodiments.

FIG. 4 illustrates an example of a package assembly that includes FIVR circuitry in a die embedded in the package, in accordance with embodiments. Diagram 400 shows package 402 coupled with a logic die 404. In embodiments, the logic die 404 may be a CPU. The package 402 may include a package core 403 as well as one or more components of a FIVR on one or more substrates that include one or more inductors 406, voltage source connections 108, and switches that may be embedded within embedded die 410.

An example FIVR circuit diagram 412 shows an example of analogous components within the package substrates 402. For example, FIVR switches 410a may be implemented using embedded die 410, inductor 406a may be implemented by inductors 406, and $V_{in}$ 408a may be implemented by voltage source connection 408. The embedded die 410 may include power FETs and related circuitry to implement the FIVR switches 410a. Capacitor (C) 404a may be implemented in logic die 404 or the chip capacitors mounted on the package substrate. Capacitor 404a may represent a component in FIVR.

FIGS. 5A-5F illustrates an example of a package assembly that includes FIVR circuitry in a die embedded in the package at various stages of a manufacturing process, in accordance with embodiments.

Figure 5A:
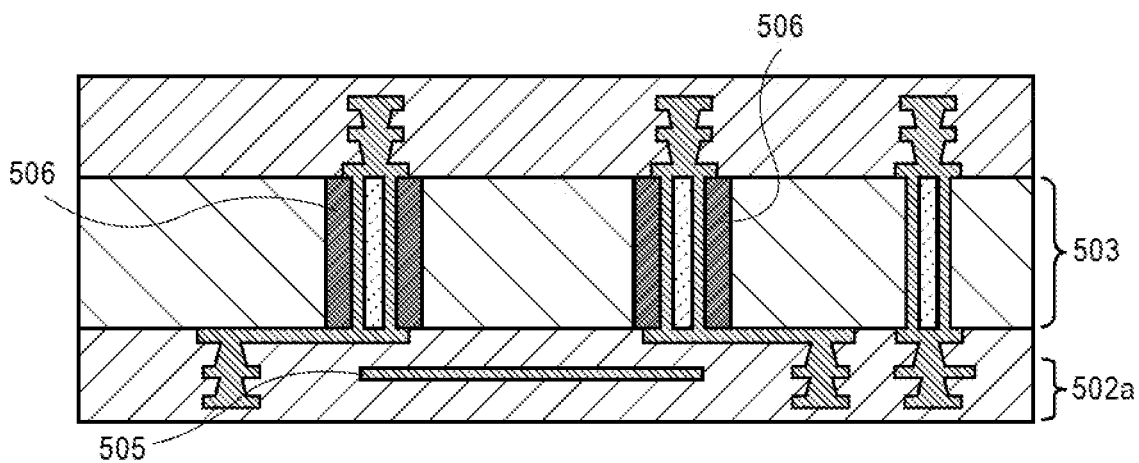
FIGS. 5A-5F illustrates an example of a package assembly that includes FIVR circuitry in a die embedded in the package at various stages of a manufacturing process, in accordance with embodiments.

FIG. 5A shows a package core 503 that may be similar to package core 403 of FIG. 4. The package core 503 may include inductors 506, which may be similar to inductors 406 of FIG. 4. In embodiments, the inductors 506 that may be created using a PTH. In embodiments, the package core 503 may be created by any known substrate process. In embodiments, the core layer 503 may not be included in the package 402, and the inductors 506 may be implemented on other substrate layers (not shown) within the package 402.

In embodiments, a Cu layer 505 may be applied and may serve as an etch stop, a backing, and/or a heat sink for the embedded die 410. In embodiments, a laminated layer 502a may be applied on top of the Cu layer 505. In embodiments, the laminated layer 502a may be made of ABF laminate or of some other build-up material.

Figure 5B:
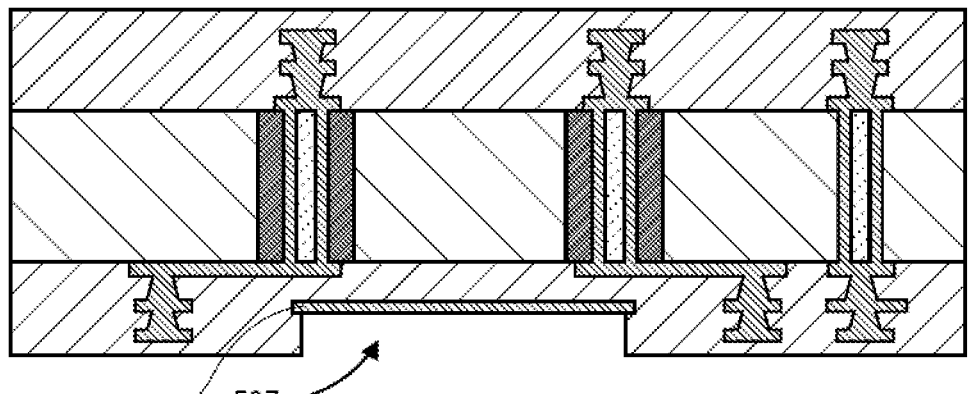

FIG. 5B shows cavity 507 that has been created in the laminated layer 502a. In embodiments, the cavity 507 may be laser drilled that may use the Cu layer 505 as a stop, exposing the Cu layer 505. A desmear process may then be implemented to clean the Cu layer 505.

Figure 5C:
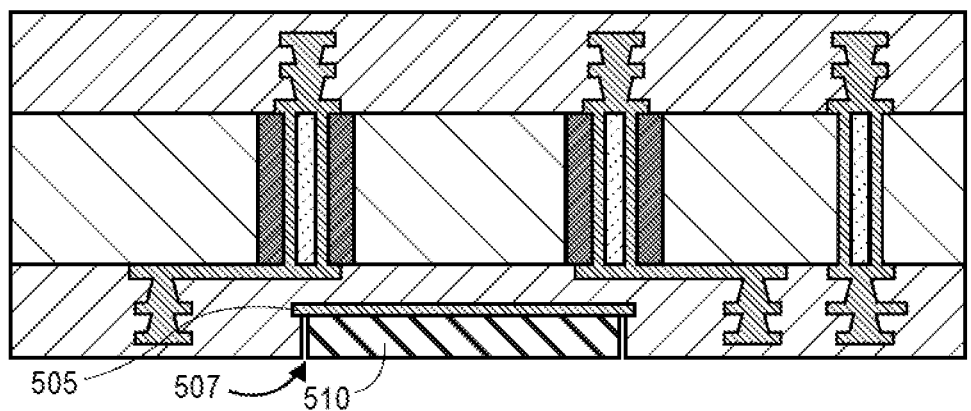

FIG. 5C shows an embedded die 510, which may be similar to embedded die 410 of FIG. 4, that is bonded in the cavity 507. In embodiments, embedded die 510 may be physically but not electrically coupled with the Cu layer 505. The embedded die 510 may include power FETs (not shown) or other circuitry (not shown) to implement switching and other functions for FIVR implementation.

Figure 5D:
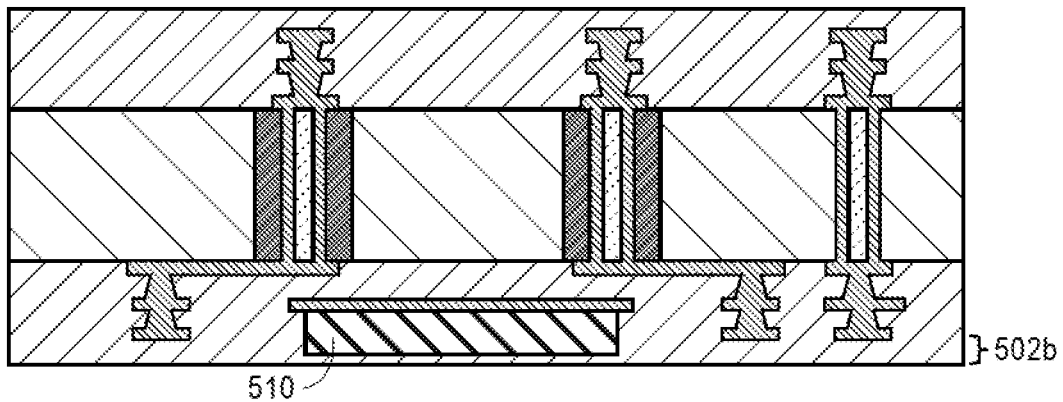

FIG. 5D shows the embedded die 510 encapsulated within the cavity 507 by the application of an additional laminate layer 502b. In embodiments, the additional laminate layer 502b may also fill open spaces left in cavity 507 after embedded die 510 is inserted. In embodiments, the laminate layer 502b may include ABF.

Figure 5E:
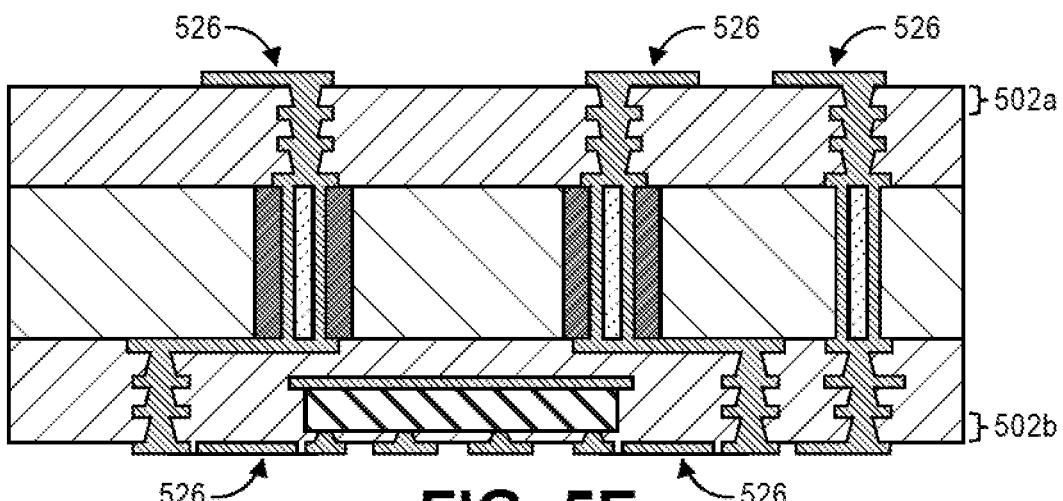

FIG. 5E shows results of a semi-additive process or other processes to fill the vias 224 and plate a Cu or other metal patterns on the additional laminate layer 502b or the top laminate layer 502a. In embodiments, capacitors and/or other circuitry (not shown) may be fabricated as required. For example, elytic Cu, or some other suitable metal, may be used to create, routings 526, for example, for terminals of gates, sources, and/or drains on the additional laminate layer 502b or the top laminate layer 502a.

Other processes that may be used may include electroless Cu application, dry film resists (DFR) lamination/exposure/development, DFR stripping, flash etching, and/or Cu roughening.

Figure 5F:
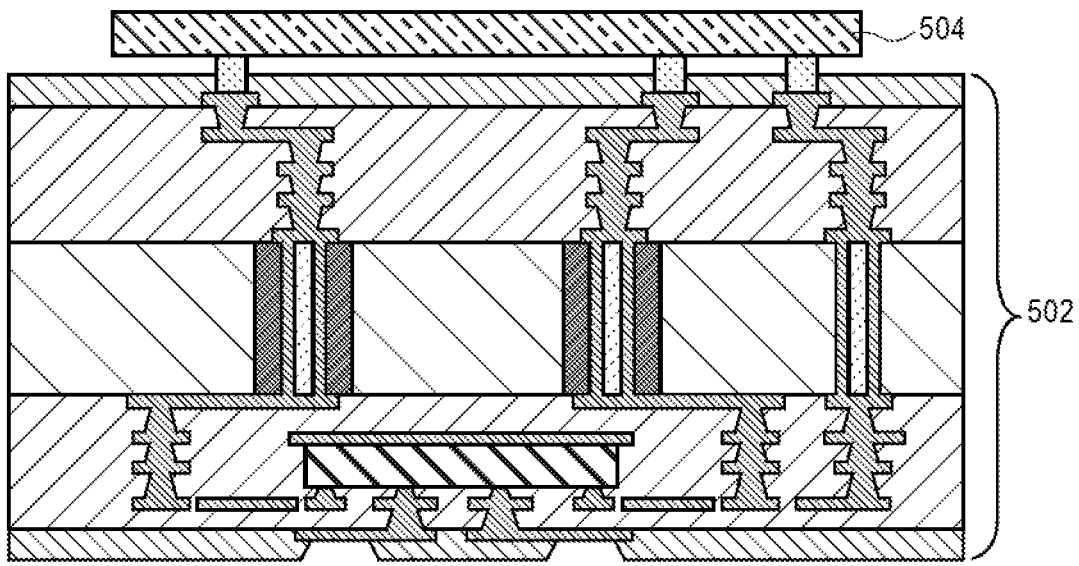

FIG. 5F shows the application of the logic die 504, which may be similar to logic die 404 of FIG. 4, to the package 502, which may be similar to package 402.

Figure 6:
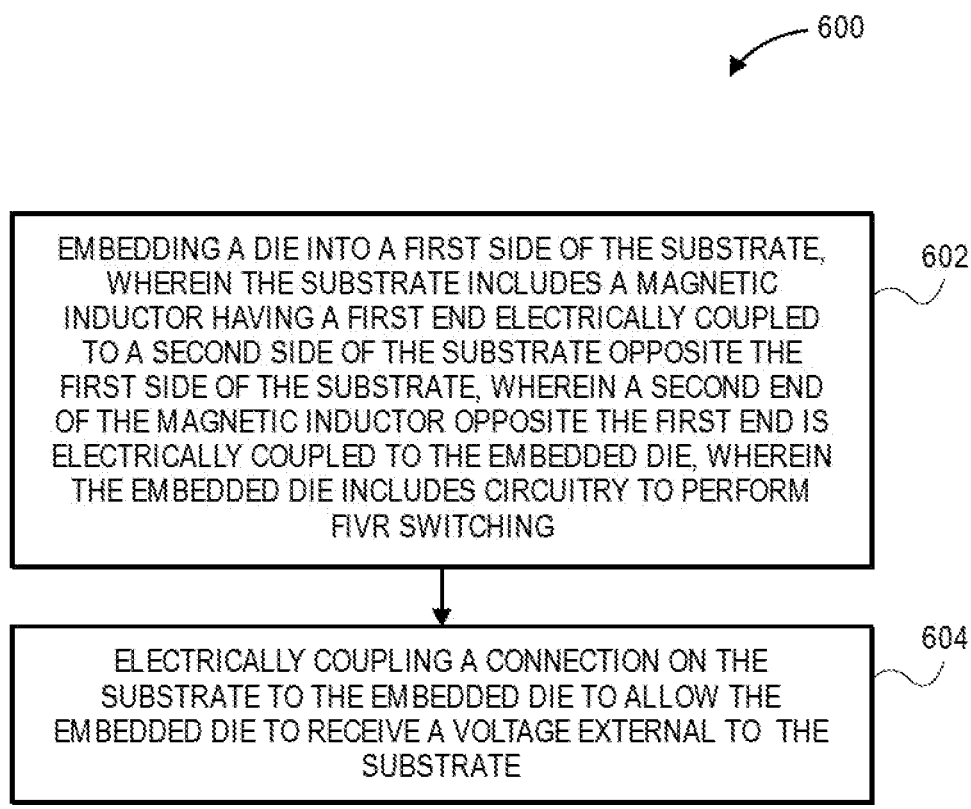
FIG. 6 illustrates an example of a process for manufacturing a package assembly that includes FIVR circuitry in an embedded die within the package, in accordance with embodiments.

FIG. 6 illustrates an example of a process for manufacturing a package assembly that includes FIVR circuitry in an embedded die within the package, in accordance with embodiments. In embodiments, process 600 may be performed by one or more of the techniques, processes, or actions described with respect to FIGS. 4-5F.

At block 602, the process may include embedding the die into a first side of the substrate, wherein the substrate includes an inductor having a first end electrically coupled to a second side of the substrate opposite the first side of the substrate, wherein a second end of the inductor opposite the first end is electrically coupled to the embedded die, wherein the embedded die includes circuitry to perform FIVR switching. In embodiments, the embedded die may be similar to embedded die 410 and the substrate may be similar to substrate 402 of FIG. 4. The inductor may be similar to inductor 406 of FIG. 4.

At block 604, the process may include electrically coupling a connection on the substrate to the embedded die to allow the embedded die to receive a voltage external to the substrate. In embodiments, the connection may be similar to voltage source connection 408 of FIG. 4. In embodiments, after coupling the embedded die, which may be similar to embedded die 410, is coupled to the voltage source connection 408, the elements that are within the FIVR circuit diagram 412 will be represented in the package shown in diagram 400.

Figure 7:
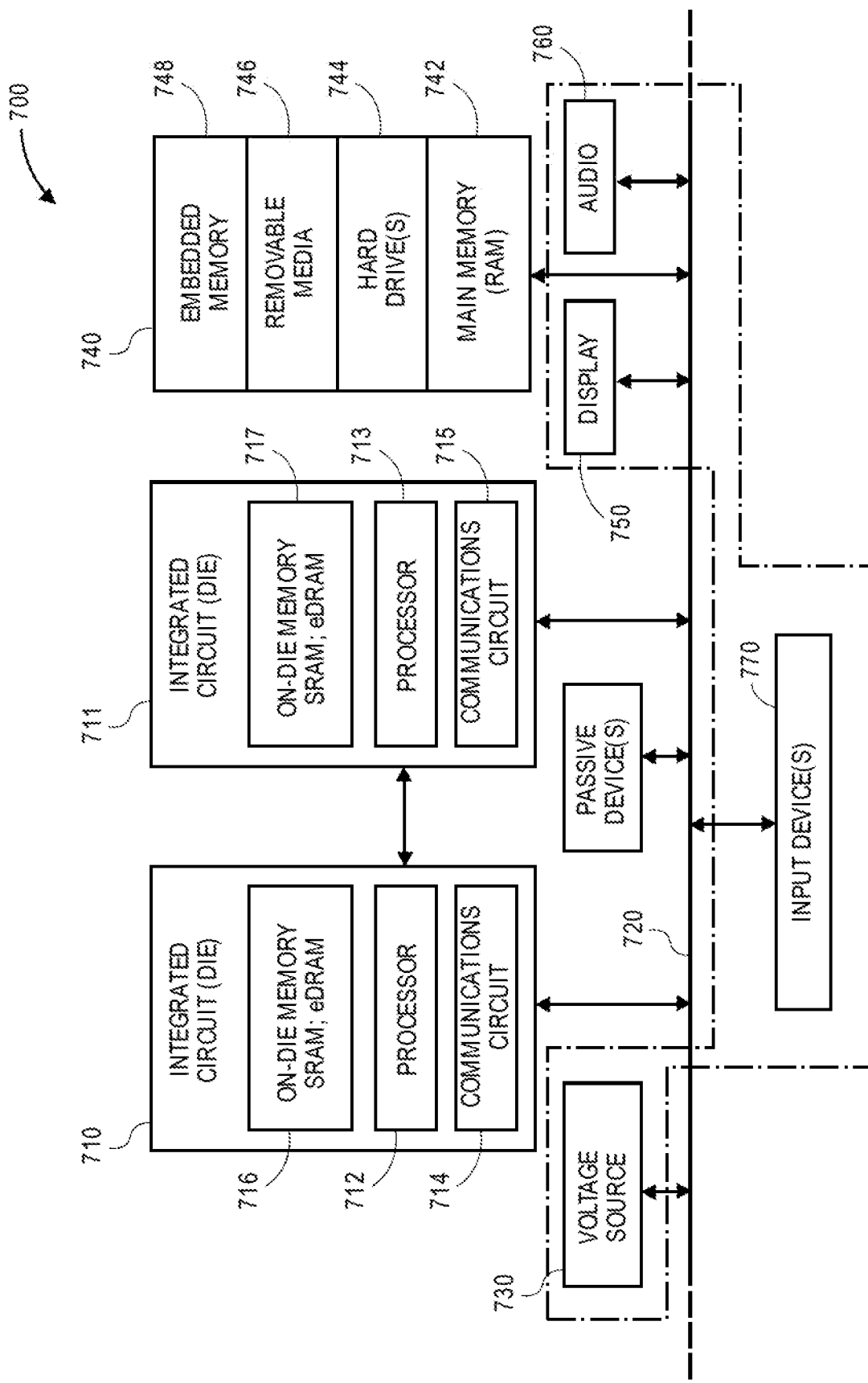
FIG. 7 is a schematic of a computer system, in accordance with an embodiment of the present invention.

FIG. 7 is a schematic of a computer system 700, in accordance with an embodiment of the present invention. The computer system 700 (also referred to as the electronic system 700) as depicted can embody FIVR circuitry within a substrate, according to any of the several disclosed embodiments and their equivalents as set forth in this disclosure. The computer system 700 may be a mobile device such as a netbook computer. The computer system 700 may be a mobile device such as a wireless smart phone. The computer system 700 may be a desktop computer. The computer system 700 may be a hand-held reader. The computer system 700 may be a server system. The computer system 700 may be a supercomputer or high-performance computing system.

In an embodiment, the electronic system 700 is a computer system that includes a system bus 720 to electrically couple the various components of the electronic system 700. The system bus 720 is a single bus or any combination of busses according to various embodiments. The electronic system 700 includes a voltage source 730 that provides power to the integrated circuit 710. In some embodiments, the voltage source 730 supplies current to the integrated circuit 710 through the system bus 720.

The integrated circuit 710 is electrically coupled to the system bus 720 and includes any circuit, or combination of circuits according to an embodiment. In an embodiment, the integrated circuit 710 includes a processor 712 that can be of any type. As used herein, the processor 712 may mean any type of circuit such as, but not limited to, a microprocessor, a microcontroller, a graphics processor, a digital signal processor, or another processor. In an embodiment, the processor 712 includes, or is coupled with a magnetic encapsulant for magnetic inductors, as disclosed herein. In an embodiment, SRAM embodiments are found in memory caches of the processor. Other types of circuits that can be included in the integrated circuit 710 are a custom circuit or an application-specific integrated circuit (ASIC), such as a communications circuit 714 for use in wireless devices such as cellular telephones, smart phones, pagers, portable computers, two-way radios, and similar electronic systems, or a communications circuit for servers. In an embodiment, the integrated circuit 710 includes on-die memory 716 such as static random-access memory (SRAM). In an embodiment, the integrated circuit 710 includes embedded on-die memory 716 such as embedded dynamic random-access memory (eDRAM).

In an embodiment, the integrated circuit 710 is complemented with a subsequent integrated circuit 711. Useful embodiments include a dual processor 713 and a dual communications circuit 715 and dual on-die memory 717 such as SRAM. In an embodiment, the dual integrated circuit 710 includes embedded on-die memory 717 such as eDRAM.

In an embodiment, the electronic system 700 also includes an external memory 740 that in turn may include one or more memory elements suitable to the particular application, such as a main memory 742 in the form of RAM, one or more hard drives 744, and/or one or more drives that handle removable media 746, such as diskettes, compact disks (CDs), digital variable disks (DVDs), flash memory drives, and other removable media known in the art. The external memory 740 may also be embedded memory 748 such as the first die in a die stack, according to an embodiment.

In an embodiment, the electronic system 700 also includes a display device 750, an audio output 760. In an embodiment, the electronic system 700 includes an input device such as a controller 770 that may be a keyboard, mouse, trackball, game controller, microphone, voice-recognition device, or any other input device that inputs information into the electronic system 700. In an embodiment, an input device 770 is a camera. In an embodiment, an input device 770 is a digital sound recorder. In an embodiment, an input device 770 is a camera and a digital sound recorder.

As shown herein, the integrated circuit 710 can be implemented in a number of different embodiments, including a package substrate having FIVR circuitry within a substrate, according to any of the several disclosed embodiments and their equivalents, an electronic system, a computer system, one or more methods of fabricating an integrated circuit, and one or more methods of fabricating an electronic assembly that includes a package substrate having FIVR circuitry within a substrate, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having FIVR circuitry within a substrate embodiments and their equivalents. A foundation substrate may be included, as represented by the dashed line of FIG. 7. Passive devices may also be included, as is also depicted in FIG. 7.

The following paragraphs describe examples of various embodiments.

Example 1 may be a package comprising: a substrate, having a first side and a second side opposite the first side, the first side of the substrate to electrically couple with a die and to provide voltage to the die, and the second side of the substrate to couple with an input voltage source; and wherein the substrate is to include fully integrated voltage regulator (FIVR) circuitry to regulate a voltage to the die.

Example 2 may be the package of example 1, wherein at least a portion of the FIVR circuitry is included within another die included within the substrate and electrically coupled with the first side of the substrate and with the second side of the substrate.

Example 3 may be the package of example 2, wherein the other die has a first side and a second side opposite the first side, and wherein the first side of the other die is adjacent to a metal layer.

Example 4 may be the package of example 2, wherein the other die is disposed within a cavity in a layer of the substrate.

Example 5 may be the package of example 1, wherein at least a portion of the FIVR circuitry further includes one or more Organic Field Effect Transistors (OFET) within the substrate to provide FIVR switching circuitry.

Example 6 may be the package of example 5, wherein at least one of the one or more OFET has a thickness of approximately 1 micrometer.

Example 7 may be the package of example 5, wherein a copper (Cu) block is proximate to the OFET to serve as a heat sink for the OFET.

Example 8 may be the package of example 1, wherein at least a portion of the FIVR circuitry further includes one or more carbon nanotubes transistor (CNT) within the substrate to provide FIVR switching circuitry.

Example 9 may be the package of example 1, wherein at least a portion of the FIVR circuitry further includes one or more oxide thin-film transistors within the substrate to provide FIVR switching circuitry.

Example 10 may be the package of any one of example 1-9, wherein one or more air core inductors or magnetic inductors are disposed between and are electrically coupled to the first side of the substrate and to the FIVR circuitry.

Example 11 may be a method for creating a fully integrated voltage regulator (FIVR) within a substrate using an embedded die, the method comprising: embedding the die into a first side of the substrate, wherein the substrate includes a inductor having a first end electrically coupled to a second side of the substrate opposite the first side of the substrate, wherein a second end of the inductor opposite the first end is electrically coupled to the embedded die, wherein the embedded die includes circuitry to perform FIVR switching; and electrically coupling a connection on the substrate to the embedded die to allow the embedded die to receive a voltage external to the substrate.

Example 12 may be the method of example 11, wherein embedding the die into to the first side of the substrate further includes: applying a metal layer to a portion of the first side of the substrate; applying a dielectric layer to cover at least a portion of the metal layer; removing a portion of the applied dielectric layer to form a cavity within the applied dielectric layer, wherein the metal layer is to provide an edge of the cavity; and inserting the die into the cavity.

Example 13 may be the method of example 12, wherein removing a portion of the applied dielectric layer further includes laser drilling or etching the applied dielectric layer.

Example 14 may be the method of any one of example 12-13, wherein the dielectric layer is a buildup layer.

Example 15 may be the method of example 11, wherein the inductor is a first inductor; and further comprising a second inductor, wherein the first and the second inductors are substantially perpendicular to a plane of the substrate.

Example 16 may be a method for creating a fully integrated voltage regulator (FIVR) within a substrate, the method comprising: coupling a transistor onto a first side of the substrate, wherein the substrate includes a magnetic inductor having a first end electrically coupled to a second side of the substrate opposite the first side of the substrate, wherein a second end of the inductor opposite the first end is electrically coupled to the transistor and wherein the transistor is to provide FIVR switching; and electrically coupling a connection on the substrate to the transistor to allow the transistor to receive a voltage external to the substrate.

Example 17 may be the method of example 16, wherein the inductor is a first inductor; and further comprising a second inductor, wherein the first and the second inductors are substantially perpendicular to a plane of the substrate.

Example 18 may be the method of example 16, wherein the transistor is an Organic Field Effect Transistor (OFET); and wherein coupling the OFET onto a first side of the substrate further includes coupling the OFET using lithography or using printing and laser sintering.

Example 19 may be the method of example 16, wherein the transistor is a carbon nanotube transistor (CNT); and wherein applying the CNT onto a first side of the substrate further includes printing a nanoparticle solution onto the first side of the substrate.

Example 20 may be the method of example 19, further comprising sintering nanoparticles included in the nanoparticle solution using an ion laser beam to form conductor patterns.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

What is claimed is:

1. A package comprising:
    a substrate, having a first side and a second side opposite the first side, the first side of the substrate electrically coupled with a die as a voltage source to the die, and the second side of the substrate to couple with an input voltage source;
    wherein the substrate includes a fully integrated voltage regulator (FIVR) circuitry to regulate a voltage to the die; and
    wherein the substrate includes one or more inductors electrically coupled with the FIVR and with the die, the one or more inductors include a magnetic material at least partially surrounding plated thru holes (PTH) that extend through a core of the substrate; and
    wherein the substrate includes a high-side (HS) field effect transistor (FET) or a low-side (LS) FET electrically coupled with the one or more inductors.

2. The package of claim 1, wherein at least a portion of the FIVR circuitry is included within another die included within the substrate and electrically coupled with the first side of the substrate and with the second side of the substrate.

3. The package of claim 2, wherein the another die has a first side and a second side opposite the first side, and wherein the first side of the another die is adjacent to a metal layer.

4. The package of claim 2, wherein the another die is disposed within a cavity in a layer of the substrate.

5. The package of claim 1, wherein the HS FET or the LS FET are printed on a layer of the substrate.

6. The package claim 1, further comprising a copper (Cu) block proximate to the HS FET or to the LS FET that transmits or receives heat.

7. The package of claim 1, wherein at least a portion of the FIVR circuitry further includes one or more carbon nanotubes transistor (CNT) within the substrate to provide FIVR switching circuitry.

8. The package of claim 1, wherein at least a portion of the FIVR circuitry further includes one or more oxide thin-film transistors within the substrate to provide FIVR switching circuitry.

9. The package of claim 1, wherein one or more air core inductors or magnetic inductors are disposed between and are electrically coupled to the first side of the substrate and to the FIVR circuitry.

* * * * *